(12) United States Patent
Matsumoto

(10) Patent No.: US 6,388,316 B1
(45) Date of Patent: May 14, 2002

(54) SEMICONDUCTOR MODULE

(75) Inventor: Hideo Matsumoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/835,582

(22) Filed: Apr. 17, 2001

(30) Foreign Application Priority Data

Oct. 31, 2000 (JP) .............................. 12-332471

(51) Int. Cl.[7] .......................... H01L 23/12; H01L 23/13
(52) U.S. Cl. ...................... 257/700; 257/692; 257/723
(58) Field of Search ................................. 257/685, 690, 257/692, 700, 704, 723

(56) References Cited

U.S. PATENT DOCUMENTS 5,488,256 A * 1/1996 Tsunoda ..................... 257/691
6,064,116 A * 5/2000 Akram ....................... 257/700
6,252,305 B1 * 6/2001 Lin et al. .................... 257/686

FOREIGN PATENT DOCUMENTS

JP    2000-091365 A    *   3/2000   ........... H01L/21/56

* cited by examiner

Primary Examiner—Allan R. Wilson
(74) Attorney, Agent, or Firm—Oblon, Spivak, McClelland, Maier & Neustadt, P.C.

(57) ABSTRACT

Providing a semiconductor module comprising a plurality of semiconductor elements, in which wiring lengths of the semiconductor elements juxtaposed to each other are approximately the same. A semiconductor module comprising a lower layer substrate and an upper layer substrate, in which a first and a second electrode pads formed in a front surface of the lower layer substrate are connected with a first and a second wires by a first and a second bridge wires disposed in a back surface of the upper layer substrate.

11 Claims, 5 Drawing Sheets

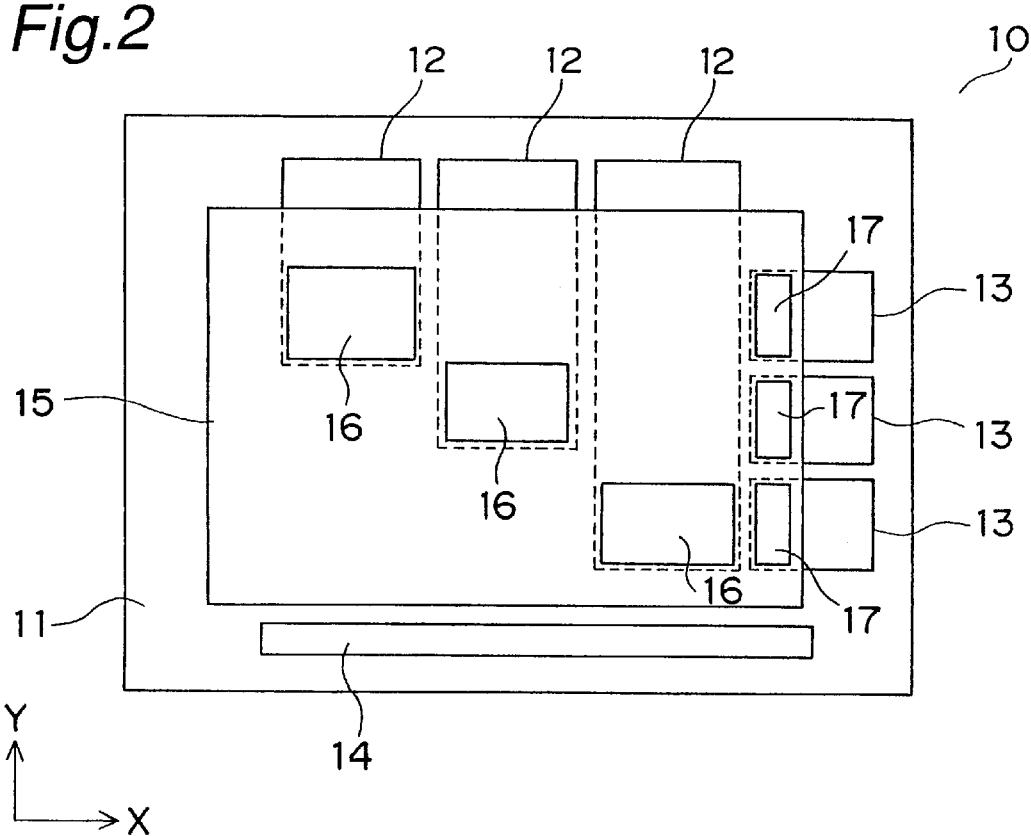
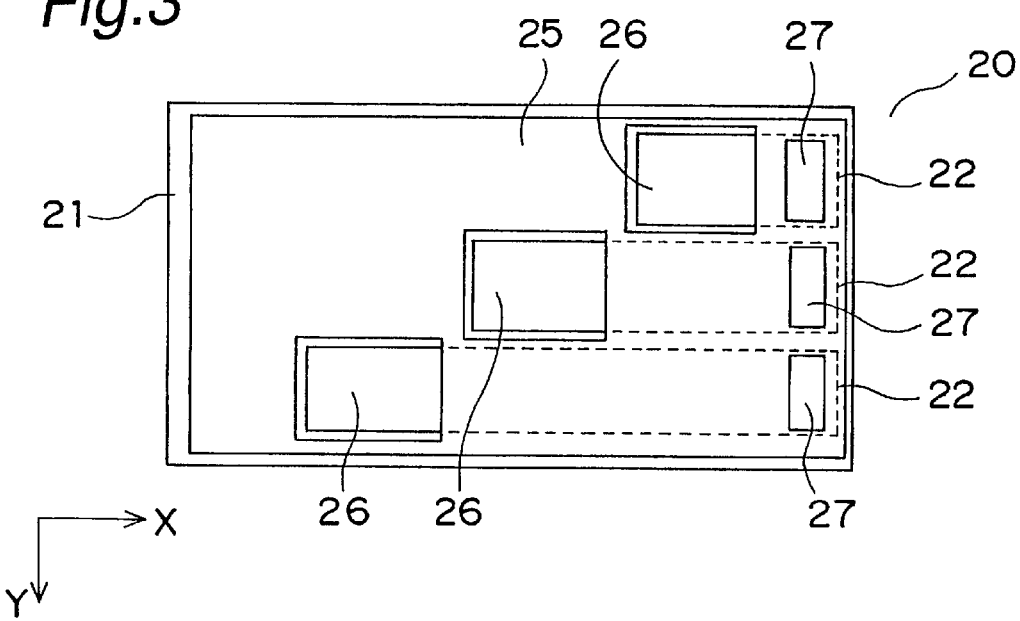

SEMICONDUCTOR MODULE

BACKGROUND OF THE INVENTION

The present invention relates to a semiconductor module, and more particularly, a semiconductor module comprising a plurality of semiconductor elements connected in parallel to each other.

FIG. 7A is a plan view of a conventional semiconductor module (a lid portion is not shown), and FIG. 7B is a cross sectional view along lines IV—IV in FIG. 7B.

As shown in FIGS. 7A and 7B, in the conventional semiconductor module generally denoted at 200, an insulation substrate 71 is placed on a base plate 1. In a front surface of the insulation substrate 71, a gate wire pattern 14, a collector wire pattern 72, and an emitter wire pattern 73 are formed. On the collector wire pattern 72, a plurality of insulated gate bipolar transistors 31 (hereinafter referred to as "IGBTs") and free wheel diodes 32 (hereinafter referred to as "diodes") are disposed. Collectors of the IGBTs 31 and cathodes of the diodes 32 are connected with the collector wire pattern 72.

As shown in FIG. 7A, the emitter wire pattern 73 is formed in the shape of the letter "L" along two sides of the collector wire pattern 72. Meanwhile, the gate wire pattern 14 is formed along other one side of the collector wire pattern 72. This is for the ease of work at a bonding step for connecting the respective wire patterns with the IGBTs 31 and the like.

A back surface pattern 74 is formed in a back surface of the insulation substrate 71, and fixed on the base plate 1 by a solder layer 2.

The IGBTs 31 and the diodes 32 are connected respectively with the gate wire pattern 14 and the emitter wire pattern 73 by bonding wires 35 and 34. Further, the gate wire pattern 14, the emitter wire pattern 73 and the collector wire pattern 72 are connected respectively with gate electrodes 41, collector electrodes 42 and emitter electrodes 43 by bonding wires 36, 37 and 38.

A case portion 6 is formed on the base plate 1 so as to surround the insulation substrate 71. After wire bonding of the IGBTs 31 and the like, a gel material 7 for sealing is injected inside the case portion 6, and a lid portion 8 is put on.

In the semiconductor module 200 with the conventional structure, since wiring distances from the emitter electrodes 43 to the diodes 32 arranged in parallel to each other are different from each other, loads (such as impedance, capacitance) of the wires are different from each other among the diodes 32. Hence, even when the semiconductor module is applied with a constant voltage, for example, voltages applied to the diodes 32 arranged in parallel to each other are different from each other, which may destroy some of the diodes. This also applies to the IGBTs 31.

In addition, to allow the semiconductor module to carry a large current, it is necessary that a cross section of the wire patterns has a large size. In contradiction to this, if the wire patterns are thick, there is a problem that the insulation substrate 71 cracks due to a difference in expansion coefficient between the insulation substrate 71 of a ceramic material and the wire pattern 73 of metal. Further, if the width of the wire pattern 73 is large, there is a problem that it is difficult to complete the semiconductor module in a small size.

SUMMARY OF THE INVENTION

In view of this, a first object of the present invention is to provide a semiconductor module in which wiring lengths of semiconductor elements arranged in parallel to each other are approximately the same.

A second object of the present invention is to provide a semiconductor module in which a cross section of wire patterns has a large size without increasing a module size.

The present invention is directed to a semiconductor module in which at least two semiconductor elements arranged along a certain direction, and at least two electrode pad regions arranged along a direction approximately perpendicular to said certain direction, are respectively connected in parallel to each other, characterized in comprising:

a) a base plate;

b) a lower layer substrate comprising: a first insulation substrate in approximately rectangular shape with the back surface fixed on said base plate; a first and a second electrode pads in approximately identical shapes disposed on a front surface of said first insulation substrate along one side of said first insulation substrate so as to be juxtaposed to each other in this order from a corner portion of said one side; and first and second wires which are juxtaposed to each other along other side of said first insulation substrate approximately perpendicular to said one side and including said corner portion of said one side, said second wire extending by the side of said first and said second electrode pads, and said first wire extending by the side of said first electrode pad with said second wire interposed;

c) an upper layer substrate disposed on said lower layer substrate, comprising: a second insulation substrate in approximately rectangular shape; and a first bridge wire connecting said first wire with said first electrode pad and a second bridge wire connecting said second wire with said second electrode pad, which are formed in a back surface of said second insulation substrate;

d) a first semiconductor element electrically connected with said first wire and a second semiconductor element electrically connected with said second wire, which are formed in a front surface of said second insulation substrate; and e) a cap disposed on said base plate so as to cover said lower layer substrate, said upper layer substrate, and said first and said second semiconductor elements.

In this semiconductor module, wiring lengths from the semiconductor elements to emitter electrodes are approximately uniform between the semiconductor elements arranged in parallel to each other.

This allows achieving approximately the same loads, such as impedances, between the wires arranged in parallel to each other.

As a result, it is possible to prevent overload-induced malfunction of some semiconductor elements occurring in a conventional semiconductor module, and hence, to improve the reliability of the semiconductor module.

Since a semiconductor module herein described comprises two semiconductor elements, a semiconductor module comprising three or more semiconductor elements is also within the scope of the present invention. Further, the cap portion is formed by a case portion and a lid portion.

The present invention is also directed to a semiconductor module further comprising a solder resist layer coating a front surface of said lower layer substrate, characterized in that said first bridge wire and both of said first wire and said first electrode pad are connected with each other by solder layers buried in holes formed in said solder resist layer, while said second bridge wire and both of said second wire and said second electrode pad are connected with each other by solder layers buried in holes formed in said solder resist layer.

Use of the solder resist layer makes it easy to use a structure in which wire layers intersect each other.

A surface area of said lower layer substrate is preferably larger than a surface area of said upper layer substrate, and said first and said second wires and said first and said second electrode pads extend preferably beyond said upper layer substrate covering said lower layer substrate.

With this structure, it is easy to perform wire bonding.

The first and said second semiconductor elements and said first and said second wires may be connected with each other by bonding wires and said first and said second electrode pads and an external electrode may be connected with each other by bonding wires.

The present invention is directed further to a semiconductor module in which at least two semiconductor elements juxtaposed to each other along a certain direction, and an electrode pad region arranged along a direction approximately perpendicular to said certain direction, are connected with each other, characterized in comprising:

a) a base plate;

b) a lower layer substrate comprising: a first insulation substrate in approximately rectangular shape with the back surface fixed on said base plate; and a lower layer wiring conductor in approximately rectangular shape formed in a front surface of said first insulation substrate, wherein said lower layer wiring conductor has a slit cut toward inside from one of the corner portions or the near, an area of said lower layer wiring conductor along one side adjacent to said corner portion is a connection area with said semiconductor elements, and an area of said lower layer wiring conductor along other side adjacent to said corner portion is said electrode pad region;

c) an upper layer substrate disposed on said lower layer substrate, comprising: a second insulation substrate in approximately rectangular shape; and an upper layer wiring conductor in approximately rectangular shape formed in a back surface of said second insulation substrate and connected with said lower layer wiring conductor via a solder layer, wherein said upper layer wiring conductor has a slit in a portion overlapping said slit of said lower layer wiring conductor in the approximately identical shape;

d) a first and a second semiconductor elements electrically connected with said connection area of said lower layer wiring conductor, which are formed in a front surface of said second insulation substrate; and e) a cap disposed on said base plate so as to cover said lower layer substrate, said upper layer substrate, and said first and said second semiconductor elements.

In this semiconductor module, variations in wiring length between the semiconductor elements and emitter electrodes are small, which in turn reduces variations in load such as impedance.

As a result, it is possible to prevent overload-induced malfunction of some semiconductor elements occurring in a conventional semiconductor module, and hence, to improve the reliability of the semiconductor module.

Further, since a cross section of the wire patterns has a large size, impedance is small, and therefore, characteristics of the semiconductor module improve.

It is preferable that a surface area of said lower layer substrate is larger than a surface area of said upper layer substrate, and said connection area and said electrode pad region extend beyond said upper layer substrate covering said lower layer substrate.

With this structure, it is easy to perform wire bonding.

The first and said second semiconductor elements and said connection area may be connected with each other by bonding wires, and said electrode pad region and an external electrode may be connected with each other by a bonding wire.

The semiconductor elements may be formed by combinations of insulated gate bipolar transistors and free wheel diodes.

Further, a gel material may be injected so as to bury said lower layer substrate, said upper layer substrate, and said first and said second semiconductor elements.

This allows to fix the semiconductor elements, and hence, to improve the reliability of the semiconductor module.

As described clearly above, the wiring lengths of the semiconductor elements juxtaposed to each other are approximately uniform in the semiconductor module according to the present invention, and therefore, the reliability of the semiconductor module improves.

Also, in the semiconductor module according to the present invention, the cross section area of the wire portions increases, and therefore, impedance and the like decreases and the capabilities of the semiconductor module improve.

BRIEF DESCRIPTION OF THE DRAWINGS

FIG. 2 shows the front surface of the lower layer substrate in the semiconductor module according to the first embodiment of the present invention.

FIG. 3 shows the back surface of the upper layer substrate in the semiconductor module according to the first embodiment of the present invention.

DETAILED DESCRIPTION OF THE PREFERRED EMBODIMENTS

First Embodiment

Figure 1A:
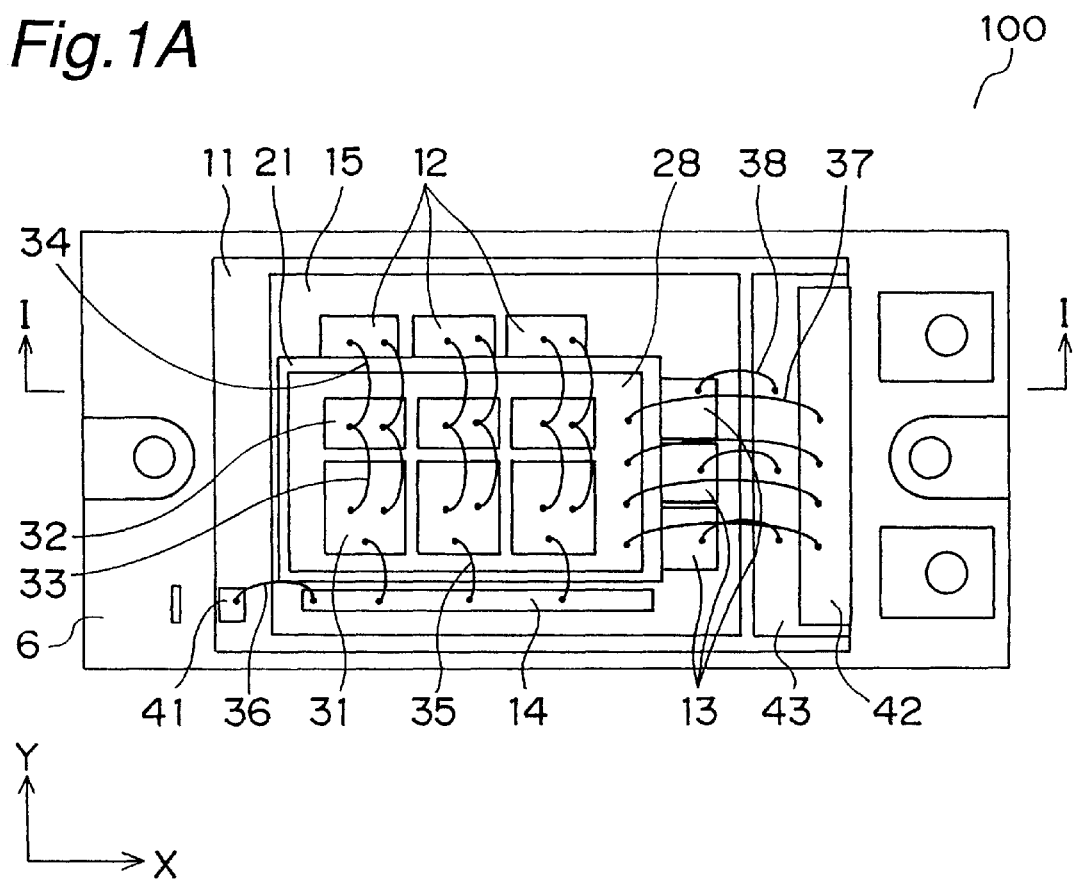
FIGS. 1A and 1B show the semiconductor module according to the first embodiment of the present invention.
Figure 1B:
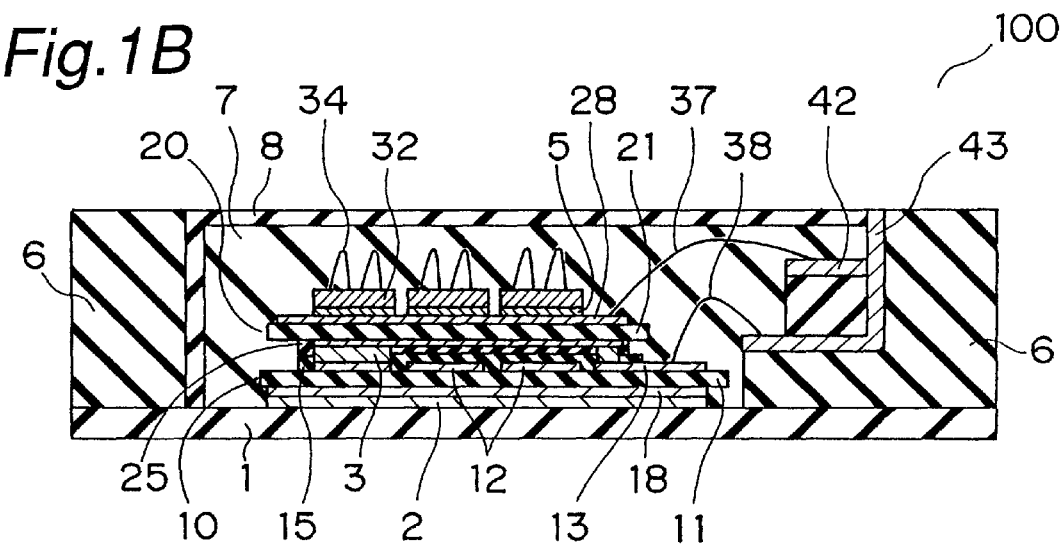

FIGS. 1A and 1B show a semiconductor module according to a first embodiment. FIG. 1A is a plan view (a lid portion is not shown) of the semiconductor module according to the first embodiment, and FIG. B is a cross sectional view along lines I—I in FIG. 1A.

As shown in FIGS. 1A and 1B, in the semiconductor module according to the first embodiment generally denoted at 100, a lower layer substrate 10 is placed on a base plate 1. The lower layer substrate 10 comprises a first insulation substrate 11. The first insulation substrate 11 is formed by a ceramic material such as AlN. In a front surface of the first insulation substrate 11, a gate wire pattern 14, emitter wire patterns 12 and emitter electrode pads 13 are formed. These wire patterns are of copper, for instance.

FIG. 2 shows a front surface of the lower layer substrate 10. Along an x-direction of the first insulation substrate 11, the emitter wire patterns 12 are juxtaposed to each other. Further, along a y-direction of the first insulation substrate 11, the emitter electrode pads 13 in approximately the same shapes are juxtaposed to each other.

The emitter wire patterns 12 have approximately the same widths (x-direction) but increasingly longer lengths (y-direction) with a distance toward the emitter electrode pads 13.

Meanwhile, in a bottom end portion of the first insulation substrate 11, the gate wire pattern 14 is disposed along the x-direction.

A solder resist layer 15 is formed at an area seating an upper layer substrate 20 in the front surface of the first insulation substrate 11. The solder resist layer 15 is formed by an insulation material such as an epoxy-based insulation material.

Opening portions 16 and 17 are formed at predetermined positions of the solder resist layer 15. The emitter wire patterns 12 are exposed in the opening portions 16. The emitter electrode pads 13 are exposed in the opening portions 17.

Further, a back surface pattern 18 of a metallic layer is formed in a back surface of the first insulation substrate 11. The back surface pattern 18 is fixed on a front surface of the base plate 1 by a solder layer 2.

The upper layer substrate 20 is placed on the lower layer substrate 10. Bridge wire patterns 22 are disposed in a back surface of the upper layer substrate 20.

FIG. 3 shows the back surface of the upper layer substrate 20. The upper layer substrate 20 comprises a second insulation substrate 21. The bridge wire patterns 22 are juxtaposed to each other along a y-direction of the second insulation substrate 21.

A solder resist layer 25 is disposed in a back surface of the second insulation substrate 21. Opening portions 26 and 27 are formed in the solder resist layer 25. The bridge wire patterns 22 are exposed within the opening portions 26 and 27. Also, the opening portions 26 and 27 are formed so as to be located over the opening portions 16 and 17 formed in the lower layer substrate 10 when the upper layer substrate 20 is placed on the lower layer substrate 10.

The emitter wire patterns 12 and the emitter electrode pads 13 of the lower layer substrate 10 and the bridge wire patterns 22 of the upper layer substrate 20 are electrically connected with each other by solder layers 3 and 4 which are buried in the opening portions 16, 17, 26 and 27.

On the other hand, a collector wire pattern 28 is disposed in a front surface of the second insulation substrate 21.

Combinations of IGBTs (insulated gate bipolar transistors) 31 and diodes (free wheel diodes) 32 are arranged next to each other along an x-direction on the collector wire pattern 28. The IGBTs 31 and the diodes 32 are connected with the collector wire pattern 28 by a solder layer 5. This electrically connects collector electrodes (not shown) of the IGBTs 31 and cathodes (not shown) of the diodes with the collector wire pattern 28.

Emitter electrodes (not shown) of the IGBTs 31 and anodes (not shown) of the diodes are connected by bonding wires 33. Further, the anodes of the diodes are connected with the emitter wire patterns 12 formed on the lower layer substrate 10, by bonding wires 34.

In addition, gate electrodes (not shown) of the IGBTs 31 are connected with the gate wire pattern 14 by bonding wires 35. The gate wire pattern 14 is connected with gate electrodes 41 by bonding wires 36.

Meanwhile, the collector wire pattern 28 is connected with the collector electrodes 42 by bonding wires 37. Also, the emitter electrode pads 13 are connected with the emitter electrodes 43 by bonding wires 38.

A case portion 6 is formed on the base plate 1 so as to surround the lower layer substrate 10 and the like. After wire bonding of the IGBTs 31 and the like, a gel material 7 for sealing is injected inside the case portion 6, and a lid portion 8 is put on.

As the lid portion 8 is fit with the case portion 6, the lower layer substrate 10 and the like are sealed off within a cap portion (not shown) formed by the case portion 6 and the lid portion 8.

Thus, in the semiconductor module 100 according to the first embodiment, the emitters of the IGBTs 31 and the anodes of the diodes 32 are connected respectively with the emitter electrodes 43 via the emitter wire patterns 12, the solder layer 3, the bridge wire patterns 22, the solder layer 4, and the emitter electrode pads 13.

In this case, as shown in FIGS. 2 and 3, the emitter wire pattern 12 shortest in the y-direction is connected with the bridge wire pattern 22 longest in the x-direction. Meanwhile, the emitter wire pattern 12 longest in the y-direction is connected with the bridge wire pattern 22 shortest in the x-direction.

This allows that wiring lengths from the IGBTs 31 and the diodes 32 to the emitter electrodes 43 are approximately uniform among the IGBTs 31 arranged side to side.

As a result, loads such as impedance from the IGBTs 31 and the diodes 32 to the emitter electrodes 43 are approximately uniform among the wires juxtaposed to each other. Hence, it is possible to prevent overload-induced malfunction of some semiconductor elements occurring in a conventional semiconductor module, and hence, to improve the reliability of the semiconductor module.

Second Embodiment

Figure 4:
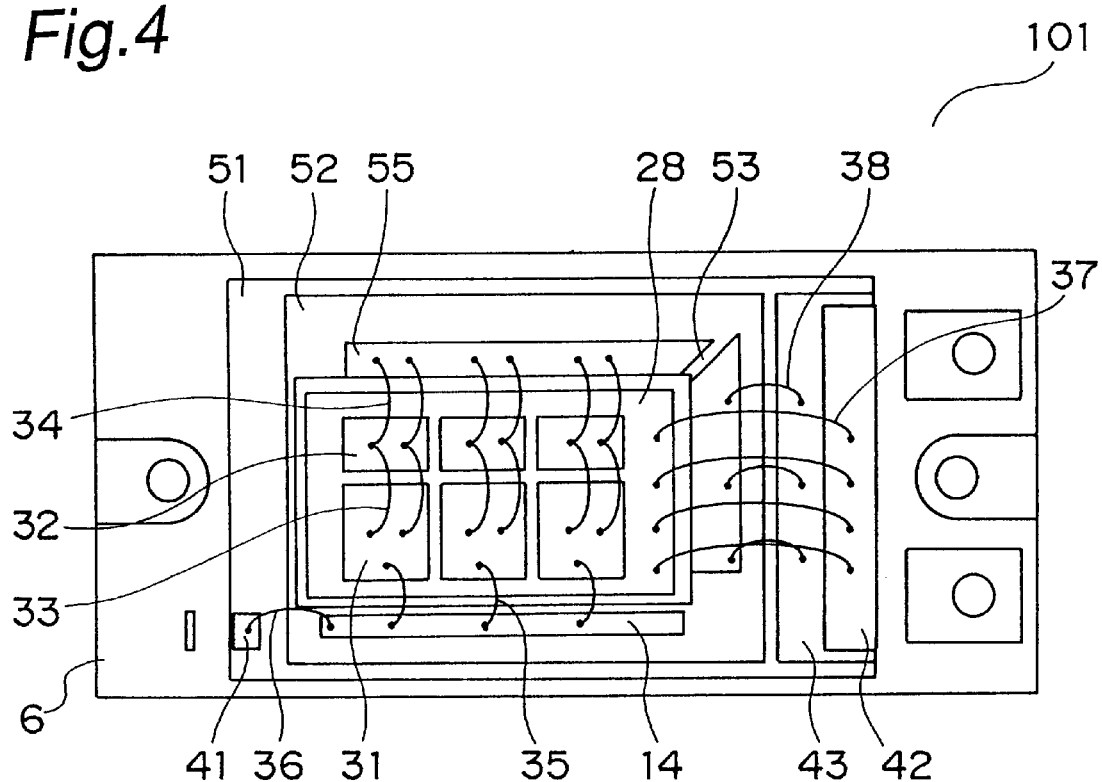
FIG. 4 shows the semiconductor module according to the second embodiment of the present invention.

FIG. 4 is a top surface view of a semiconductor module 101 according to a second embodiment.

In the semiconductor module 101, a wire pattern 55 formed in a front surface of a lower layer substrate 50 and a wire pattern 61 formed in a back surface of an upper layer substrate 60 are different from the semiconductor module 100 according to the first embodiment. Other elements in the structure are the same as in the semiconductor module 100, and therefore, are denoted at the same reference symbols as those used for the first embodiment.

Figure 5:
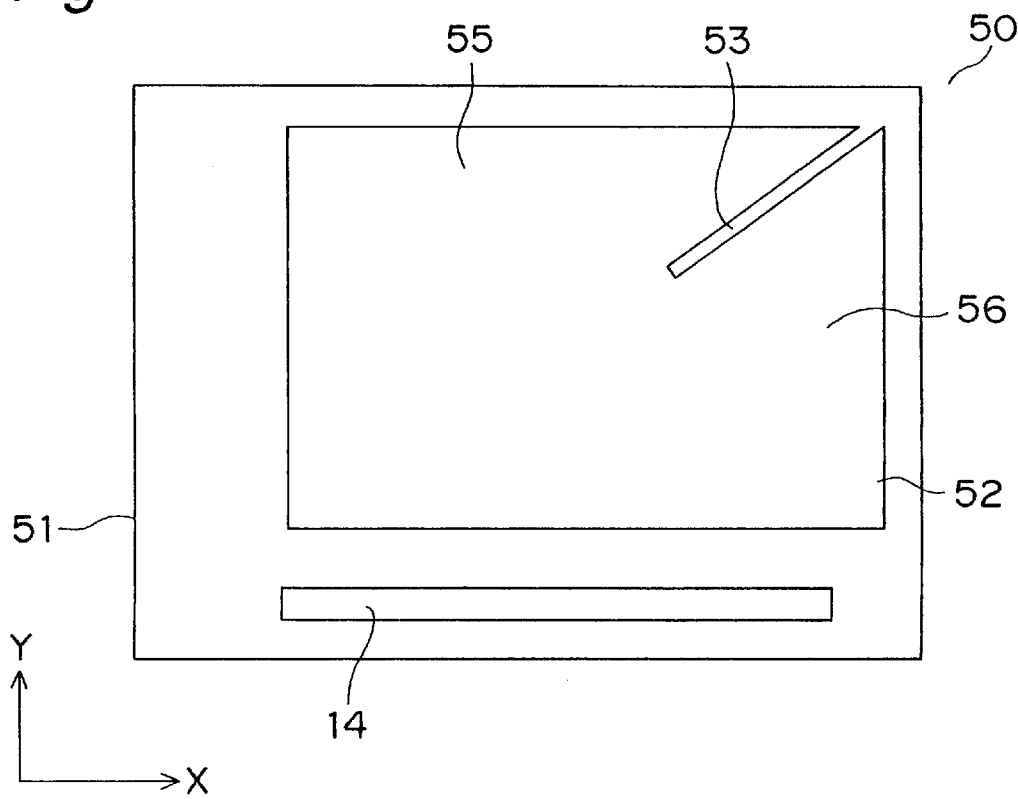
FIG. 5 shows the front surface of the lower layer substrate in the semiconductor module according to the second embodiment of the present invention.

FIG. 5 shows a front surface of the lower layer substrate 50. The lower layer substrate 50 comprises a first insulation substrate 51 of AlN, for example. A lower layer wiring conductor 52 of copper, for instance, in approximately rectangular shape is disposed on the first insulation substrate 51. Also, the gate wire pattern 14 extending along the x-direction is disposed in a bottom end portion of the first insulation substrate 51.

In the lower layer wiring conductor 52, a slit 53 is cut toward inside from a corner portion. Areas adjacent the slit 53 are a connection area 55 and an electrode pad area 56.

Figure 6:
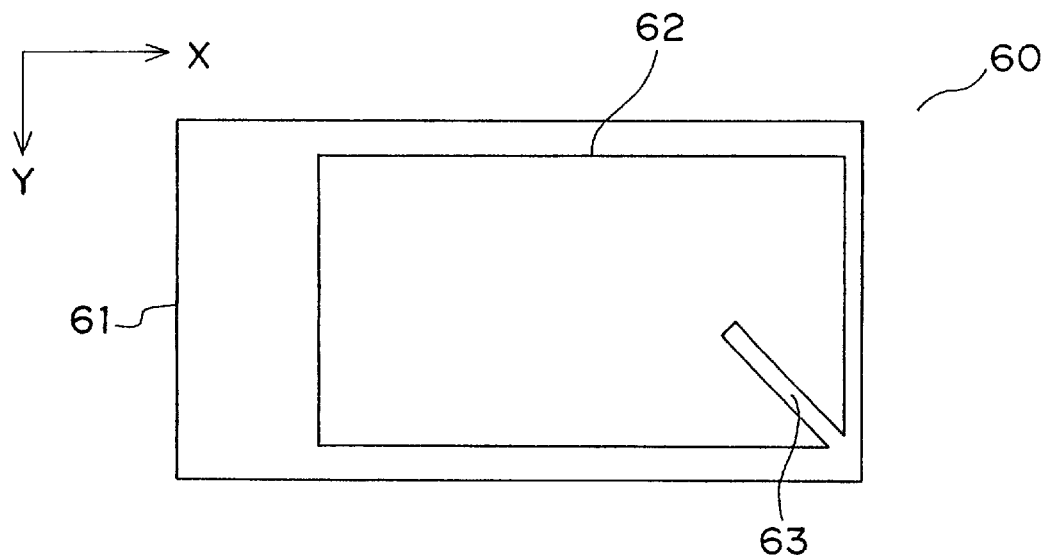
FIG. 6 shows the back surface of the upper layer substrate in the semiconductor module according to the second embodiment of the present invention.
Figure 7A:
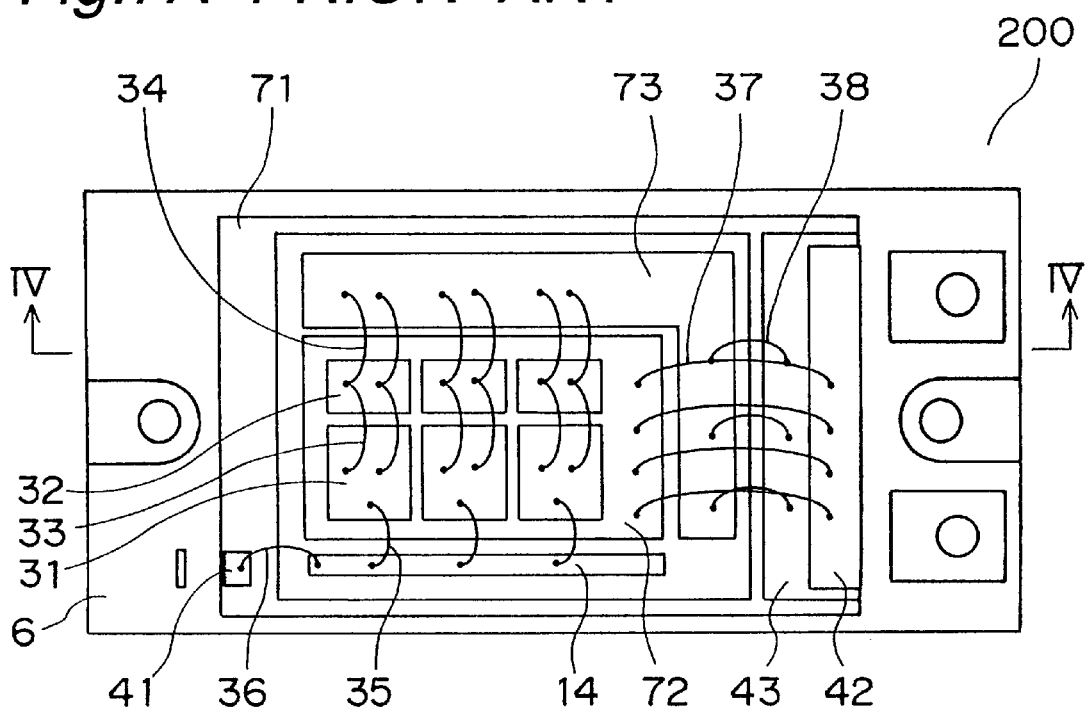
FIGS. 7A and 7B show a conventional semiconductor module.
Figure 7B:
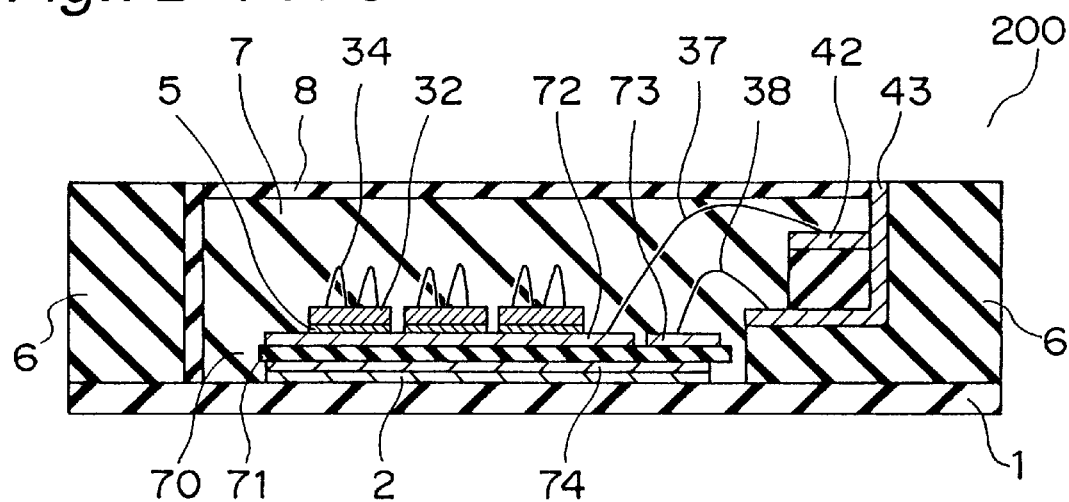

FIG. 6 shows a back surface of the upper layer substrate 60. The upper layer substrate 60 comprises a second insulation substrate 61 of AlN, for example. An upper layer wiring conductor 62 of copper, for instance, in approximately rectangular shape is disposed on the second insulation substrate 61.

In the upper layer wiring conductor 62, a slit 63 is cut toward inside from a corner portion.

As shown in FIG. 4, when the upper layer substrate 60 is placed on the lower layer substrate 50, the slit 63 overlaps the slit 53. The lower layer wiring conductor 52 and the upper layer wiring conductor 62 are electrically connected by a solder layer (not shown).

The diodes 32 are connected with the connection area 55 by the bonding wires 34. The electrode pad area 56 is connected with the emitter electrodes 43 by the bonding wires 38. Other wires are similar to those in the first embodiment.

The case portion 6 is formed on the base plate 1 so as to surround the lower layer substrate 50 and the like. After wire bonding of the IGBTs 31 and the like, a gel material for sealing (not shown) is injected inside the case portion 6, and a lid portion (not shown) is put on.

Thus, in the semiconductor module 101 according to the second embodiment, the slits 53 and 63 are formed in the lower layer wiring conductor 52 and the upper layer wiring conductor 62. Hence, wiring lengths to the electrode pad area 56 from the diodes connected with the connection area 55 in the vicinity of the slits 53 and 63 are longer than where the slits 53 and 63 are not formed. This reduces differences in the wiring lengths from the diodes 32 connected with the connection area 55 in the vicinity of the slits 53 and 63 (the right-hand side to the area 55 in FIG. 5) and from the diodes 32 connected with the connection area 55 far away from the slits 53 and 63 (the left-hand side to the area 55 in FIG. 5). As a result, as in the first embodiment, it is possible to reduce variations in loads such as impedance measured from the IGBTs 31 and the diodes 32 to the emitter electrodes 43 among the elements arranged in parallel to each other. This makes it possible to prevent overload-induced malfunction of some semiconductor elements occurring in the conventional semiconductor module 200, and hence, to improve the reliability of the semiconductor module.

Further, in the semiconductor module 101, the wire portions from the connection area 55 to the electrode pad area are formed by the lower layer wiring conductor 52, the upper layer wiring conductor 62 and the solder layers fixing the portions between the sames. This increases a cross section area of the wire portions, and decreases impedance.

While the slits 53 and 63 are cut toward inside from the corner portions of the lower layer wiring conductor 52 and the upper layer wiring conductor 62 in the second embodiment, the slits may be formed except for in the corner portions. Further, the shapes and the lengths of the slits may be changed depending on the number of the semiconductor elements and the like.

What is claimed is:

1. A semiconductor module in which at least two semiconductor elements arranged along a certain direction, and at least two electrode pad regions arranged along a direction approximately perpendicular to said certain direction, are respectively connected in parallel to each other, characterized in comprising:
    a) a base plate;
    b) a lower layer substrate comprising:
        a first insulation substrate in approximately rectangular shape with the back surface fixed on said base plate;
        a first and a second electrode pads in approximately identical shapes disposed on a front surface of said first insulation substrate along one side of said first insulation substrate so as to be juxtaposed to each other in this order from a corner portion of said one side; and
        a first and a second wires which are juxtaposed to each other along other side of said first insulation substrate approximately perpendicular to said one side and including said corner portion of said one side, said second wire extending by the side of said first and said second electrode pads, and said first wire extending by the side of said first electrode pad with said second wire interposed;
    c) an upper layer substrate disposed on said lower layer substrate, comprising:
        a second insulation substrate in approximately rectangular shape; and
        a first bridge wire connecting said first wire with said first electrode pad and a second bridge wire connecting said second wire with said second electrode pad, which are formed in a back surface of said second insulation substrate;
    d) a first semiconductor element electrically connected with said first wire and a second semiconductor element electrically connected with said second wire, which are formed in a front surface of said second insulation substrate; and
    e) a cap disposed on said base plate so as to cover said lower layer substrate, said upper layer substrate, and said first and said second semiconductor elements.

2. The semiconductor module according to claim 1 further comprising a solder resist layer coating a front surface of said lower layer substrate, wherein said first bridge wire and both of said first wire and said first electrode pad are connected with each other by solder layers buried in holes formed in said solder resist layer, while said second bridge wire and both of said second wire and said second electrode pad are connected with each other by solder layers buried in holes formed in said solder resist layer.

3. The semiconductor module according to claim 1, wherein a surface area of said lower layer substrate is larger than a surface area of said upper layer substrate, and said first and said second wires and said first and said second electrode pads extend beyond said upper layer substrate covering said lower layer substrate.

4. The semiconductor module according to claim 1, wherein said first and said second semiconductor elements and said first and said second wires are connected with each other by bonding wires, and said first and said second electrode pads and an external electrode are connected with each other by bonding wires.

5. The semiconductor module according to claim 1, wherein said semiconductor elements are formed by combinations of insulated gate bipolar transistors and free wheel diodes.

6. The semiconductor module according to claim 1, wherein a gel material is injected so as to bury said lower layer substrate, said upper layer substrate, and said first and said second semiconductor elements.

7. A semiconductor module in which at least two semiconductor elements juxtaposed to each other along a certain direction, and an electrode pad region arranged along a direction approximately perpendicular to said certain direction, are connected with each other, comprising:
    a) a base plate;
    b) a lower layer substrate comprising:
        a first insulation substrate in approximately rectangular shape with the back surface fixed on said base plate; and
        a lower layer wiring conductor in approximately rectangular shape formed in a front surface of said first insulation substrate,
        wherein said lower layer wiring conductor has a slit cut toward inside from one of the corner portions or the near, an area of said lower layer wiring conductor along one side adjacent to said corner portion is a connection area with said semiconductor elements, and an area of said lower layer wiring conductor along other side adjacent to said corner portion is said electrode pad region;

c) an upper layer substrate disposed on said lower layer substrate, comprising:
   a second insulation substrate in approximately rectangular shape; and
   an upper layer wiring conductor in approximately rectangular shape formed in a back surface of said second insulation substrate and connected with said lower layer wiring conductor via a solder layer, wherein said upper layer wiring conductor has a slit in a portion overlapping said slit of said lower layer wiring conductor in the approximately identical shape;

d) a first and a second semiconductor elements electrically connected with said connection area of said lower layer wiring conductor, and formed in a front surface of said second insulation substrate; and e) a cap disposed on said base plate so as to cover said lower layer substrate, said upper layer substrate, and said first and said second semiconductor elements.

8. The semiconductor module according to claim 7, wherein a surface area of said lower layer substrate is larger than a surface area of said upper layer substrate, and said connection area and said electrode pad region extend beyond said upper layer substrate covering said lower layer substrate.

9. The semiconductor module according to claim 7, wherein said first and said second semiconductor elements and said connection area are connected with each other by bonding wires, and said electrode pad region and an external electrode are connected with each other by a bonding wire.

10. The semiconductor module according to claim 7, wherein said semiconductor elements are formed by combinations of insulated gate bipolar transistors and free wheel diodes.

11. The semiconductor module according to claim 7, wherein a gel material is injected so as to bury said lower layer substrate, said upper layer substrate, and said first and said second semiconductor elements.

* * * * *

UNITED STATES PATENT AND TRADEMARK OFFICE
CERTIFICATE OF CORRECTION

PATENT NO. : 6,388,316 B1
DATED : May 14, 2002
INVENTOR(S) : Matsumoto

It is certified that error appears in the above-identified patent and that said Letters Patent is hereby corrected as shown below:

<u>Title page,</u>
Item [30], the Foreign Application Data is incorrect. Item [30] should read as follows:

-- [30]          Foreign Application Priority Data
Oct. 31, 2000  (JP) - - - - - - - - - - - - - - - - - - - - - - - - - 2000-332471 --

Signed and Sealed this

First Day of October, 2002

Attest:

Attesting Officer

JAMES E. ROGAN
Director of the United States Patent and Trademark Office